US 6,735,117 B2

(12) United States Patent
Ott

(10) Patent No.: US 6,735,117 B2
(45) Date of Patent: May 11, 2004

(54) HOLD-UP POWER SUPPLY FOR FLASH MEMORY

(75) Inventor: William E. Ott, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 28 days.

(21) Appl. No.: 10/186,516

(22) Filed: Jul. 1, 2002

(65) Prior Publication Data
US 2004/0001359 A1 Jan. 1, 2004

(51) Int. Cl.[7] ............................................. G11C 16/04
(52) U.S. Cl. .................... 365/185.18; 365/226; 365/228
(58) Field of Search ............................. 365/185.18, 226

(56) References Cited
U.S. PATENT DOCUMENTS

| 5,608,684 A | * | 3/1997 | Reasoner et al. ............ 365/228 |
| 2001/0022741 A1 | * | 9/2001 | Takeuchi et al. ............ 365/145 |
| 2002/0116651 A1 | * | 8/2002 | Beckert et al. ............. 713/300 |

* cited by examiner

Primary Examiner—Hoai V. Ho

(57) ABSTRACT

A hold-up power supply for flash memory systems is provided. The hold-up power supply provides the flash memory with the power needed to temporarily operate when a power loss exists. This allows the flash memory system to complete any erasures and writes, and thus allows it to shut down gracefully. The hold-up power supply detects when a power loss on a power supply bus is occurring and supplies the power needed for the flash memory system to temporally operate. The hold-up power supply stores power in at least one capacitor. During normal operation, power from a high voltage supply bus is used to charge the storage capacitors. When a power supply loss is detected, the power supply bus is disconnected from the flash memory system. A hold-up controller controls the power flow from the storage capacitors to the flash memory system. The hold-up controller uses feedback to assure that the proper voltage is provided from the storage capacitors to the flash memory system. This power supplied by the storage capacitors allows the flash memory system to complete any erasures and writes, and thus allows the flash memory system to shut down gracefully.

16 Claims, 3 Drawing Sheets

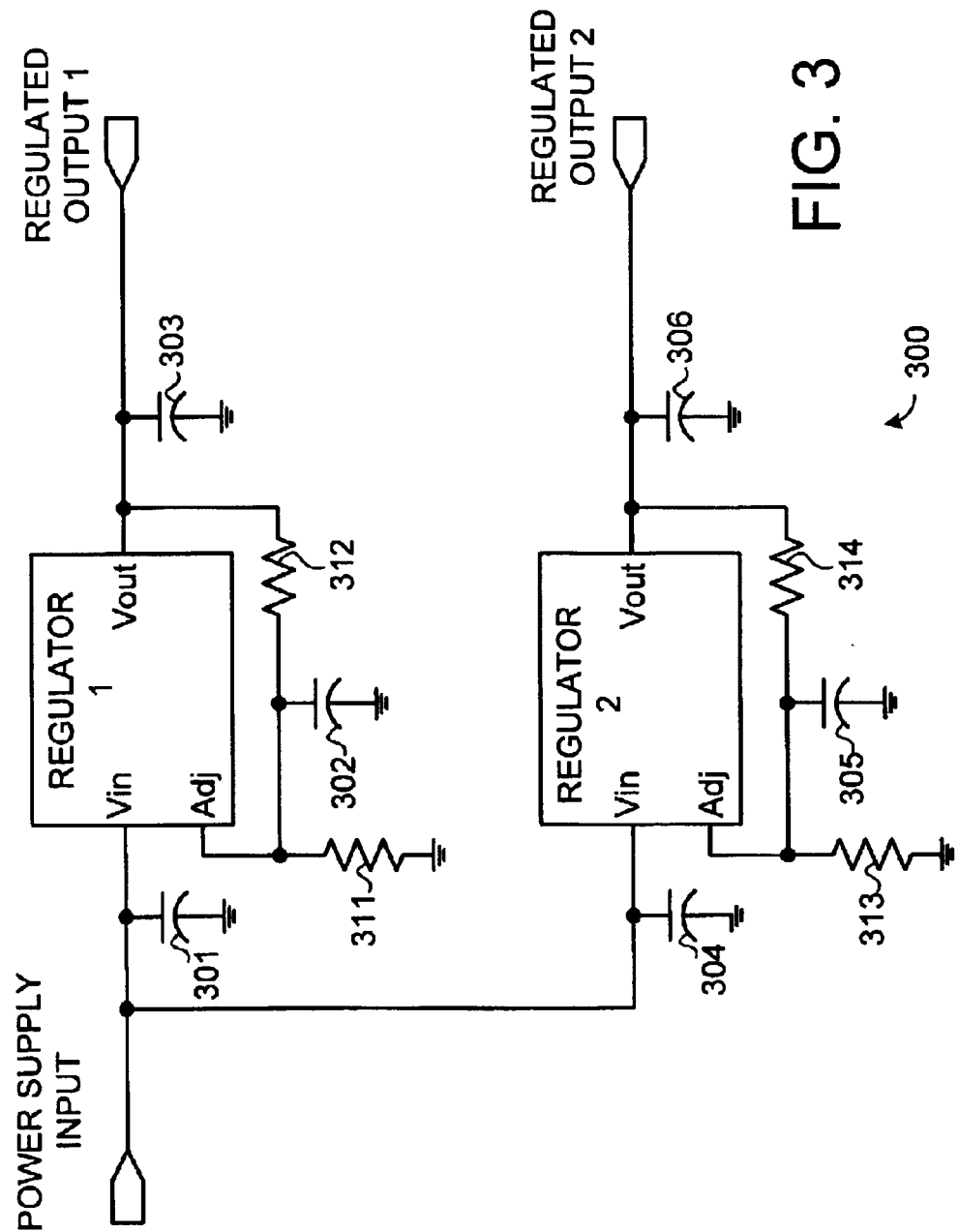

HOLD-UP POWER SUPPLY FOR FLASH MEMORY

STATEMENT OF GOVERNMENT INTEREST

The U.S. Government has a paid-up license in this invention and the right in limited circumstances to require the patent owner to license to others on reasonable terms as provided for by the terms of Contract No. NAS15-10000 awarded by the National Aeronautics and Space Administration (NASA), Boeing Subcontract No. 940S9001.

BACKGROUND OF THE INVENTION

1. Technical Field

This invention generally relates to electronic systems, and more specifically relates to power supplies for computer systems.

2. Background Art

Modern life is becoming more dependent upon computers. Computers have evolved into extremely sophisticated devices, and may be found in many different applications. These applications involve everything from application specific computers found in devices such as automobiles, planes, space vehicles and other electronics, to the general purpose computers found in the form of PDAs, personal computers, servers and mainframes.

One of the main components in modern computer systems is memory. Many different types of memory products are commonly used in computer systems. Most memory used in computer is volatile, meaning that it requires power to store information. If the power is turned off, the information stored in volatile memory is lost. In certain applications, some memory in the computer system must be able to retain the information even when power is off. For these applications, a non-volatile memory is used to store the information that cannot be lost when the power is turned off.

One common type of non-volatile memory is called flash. Flash memory is used in a wide variety of applications, such as storing control code in computer systems. In flash memory an electric charge is stored on a floating gate in each cell, with the level of the electric charge determining the value for that cell. In flash memory the memory is organized so that a section of memory cells is erased in a single action or "flash". This erase uses tunneling in which electrons pierce through a thin dielectric material to remove the electronic charge from the floating gate associated with each memory cell.

Flash memory used in critical systems must be maintained to insure that data is valid and that the status of flash memory components is known. This can be problematic in the case of power loss. In particular, when a power loss occurs during writing or erasing of flash memory, the state of the resulting data can be unknown or corrupted. This is because flash memory requires a set time period to complete erasures and write operations. If the power loss occurs before these operations are complete, the status of the memory will be unknown. This can be unacceptable in many critical systems.

Thus, what is needed is an improved method and mechanism for temporarily powering flash memory systems during power losses, ensuring that writes and erasures can complete.

DISCLOSURE OF INVENTION

The present invention provides hold-up power supply for flash memory systems. The hold-up power supply provides the flash memory system with the power needed to temporarily operate when a power loss exists. This allows the flash memory system to complete any erasures and writes, and thus allows it to shut down gracefully.

The hold-up power supply detects when a loss of power on a power supply bus is occurring and supplies the power needed for the flash memory system to operate. The holdup power supply stores power in at least one storage capacitor. During normal operation, power from a high voltage power supply bus is used to charge the storage capacitors. When a power loss is detected, the power supply bus is disconnected from the flash memory system. A hold-up controller controls the power flow from the storage capacitors to the flash memory system. The hold-up controller uses feedback to assure that the proper voltage is provided from the storage capacitors to the flash memory system. This power supplied by the storage capacitors allows the flash memory system to complete any erasures and writes, and thus allows the flash memory system to shut down gracefully.

The foregoing and other objects, features and advantages of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIG. 3 is a schematic view of voltage regulators for use with the hold-up power supply system.

BEST MODE FOR CARRYING OUT THE INVENTION

The present invention provides hold-up power supply for flash memory systems. The hold-up power supply provides the flash memory with the power needed to temporarily operate when a power loss exists. This allows the flash memory system to complete any erasures and writes, and thus allows it to shut down gracefully.

The hold-up power supply detects when a power loss on a power supply bus is occurring and supplies the power needed for the flash memory system to operate. The holdup power supply stores power in at least one capacitor. During normal operation, power from a high voltage supply bus is used to charge the storage capacitors. When a power loss is detected, the power supply bus is disconnected from the flash memory system. A hold-up controller controls the power flow from the storage capacitors to the flash memory system. The hold-up controller uses feedback to assure that the proper voltage is provided from the storage capacitors to the flash memory system. This power supplied by the storage capacitors allows the flash memory system to complete any erasures and writes, and thus allows the flash memory system to shut down gracefully.

Figure 1:
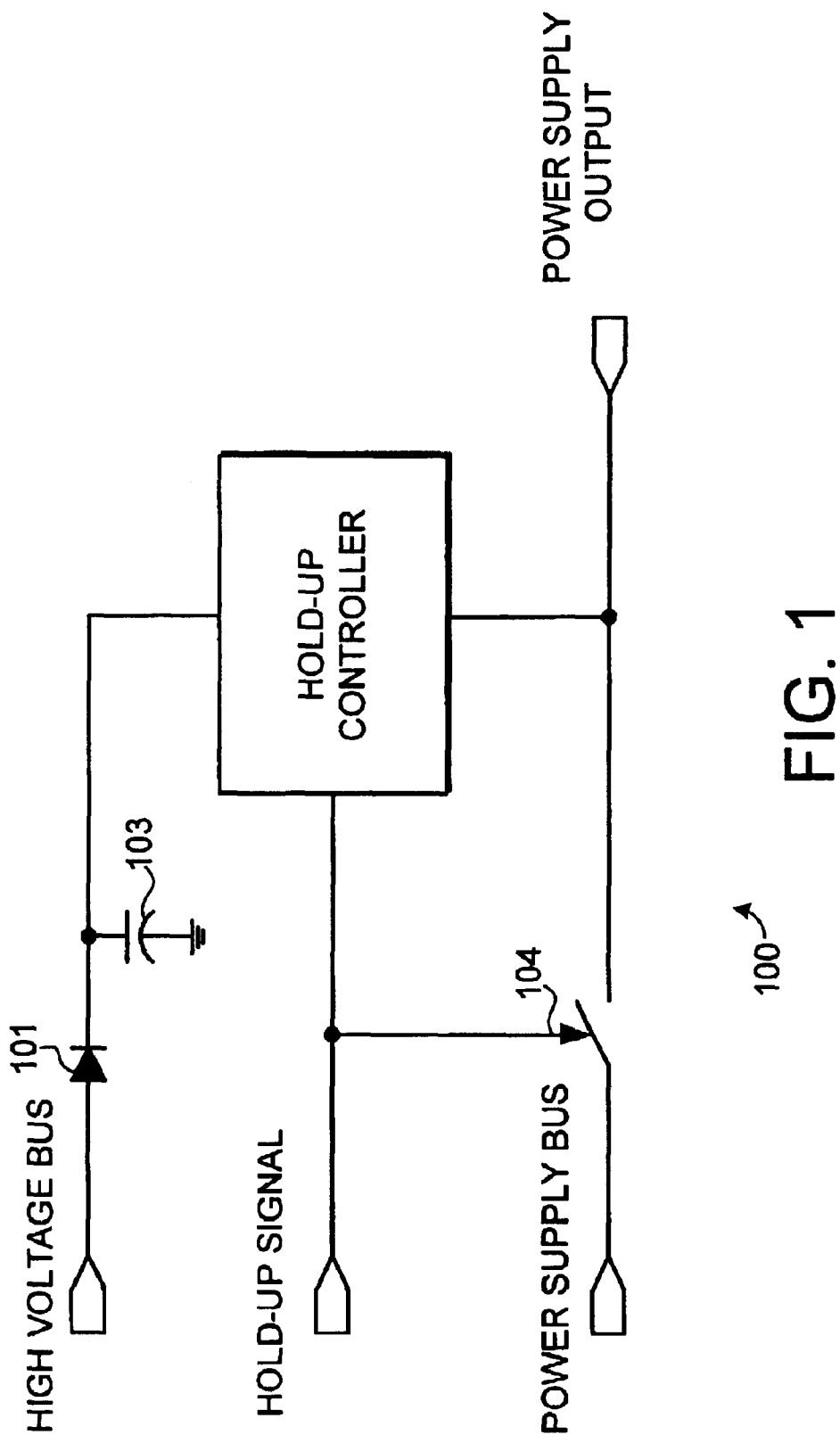
FIG. 1 is a schematic view of a hold-up power supply system for powering a flash memory.

Turning now to FIG. 1, a schematic view of a hold-up power supply system 100 is illustrated. The hold up power supply system 100 includes a diode 101, a capacitor 103, a switch 104 and a hold-up controller. The hold-up power supply receives power from a high voltage bus input and a power supply bus input, and provides power to flash memory through a power supply output. The hold-up power supply receives a hold-up signal that is used to indicate when a loss of power is about to occur.

During normal operation, the hold-up signal is disabled and the switch 104 is closed. This allows power from the power supply bus to be delivered to the power supply output, providing power to the flash memory system. The capacitor 103 stores the power that will be used to power the flash memory in the event of a power loss on the power supply bus. The high voltage bus provides the high voltage that is on the capacitor 103.

When a power loss occurs, the hold-up signal is enabled. The enabling of the hold-up signal causes the switch 104 to open. This disconnects the power supply output from the now failing power supply bus. The hold-up controller receives the hold-up signals and controllably delivers power from the capacitor 103 to the power supply output. The power from capacitor 103 provides flash memory with sufficient time to finish any writes and erasures that were in progress, enabling the flash memory to shut down gracefully. The diode 101 prevents power from flowing from capacitor 103 back into the high voltage bus, ensuring that it will be available to power the flash memory system.

The hold-up controller is used to controllably provide the power from the capacitor 103 to the power supply output. Specifically, the hold-up controller is used to provide the proper voltage needed to the power supply output. Because the capacitor 103 is charged by the high-voltage bus, it stores a voltage that is higher than desirable for the power supply output. The hold-up controller preferably uses feedback to provide a more desirable voltage to the power supply output.

The power supply bus provides the power used to supply the flash memory system during normal operation. The power supply bus thus preferably provides a voltage compatible for powering the flash memory system. Typically, the power supply bus will supply between 3 and 5 volts. Of course, other voltages can be used. As will be explained later, this power supply voltage can be further regulated before it is passed to the flash memory system. For example, the power supply bus can supply 5 volts, which is delivered to the power supply output during normal operation. The supplied five volts can be further regulated to 3.3 volts before it is passed on to the flash memory system.

The high voltage bus provides the power that is stored on capacitor 103, and is used to power the power supply output during power loss. The high voltage bus provides a voltage that is higher than the power supply bus voltage. This allows the capacitor 103 to store sufficient energy to power the flash memory temporarily without requiring excessive capacitor size. As an example, the high power bus can supply between 12 and 19 volts. As a further example, when the power supply bus provides 5 volts, the high voltage bus can provide 18.9 volts.

The hold-up signal can be any suitable signal that is enabled when a power loss occurs, with any suitable means of detecting a power loss. It is generally desirable that the hold-up signal become enabled immediately after the power loss occurs. This allows the hold-up power supply to immediately begin to provide supplemental power, allowing the flash memory system to shut down gracefully.

Figure 2:
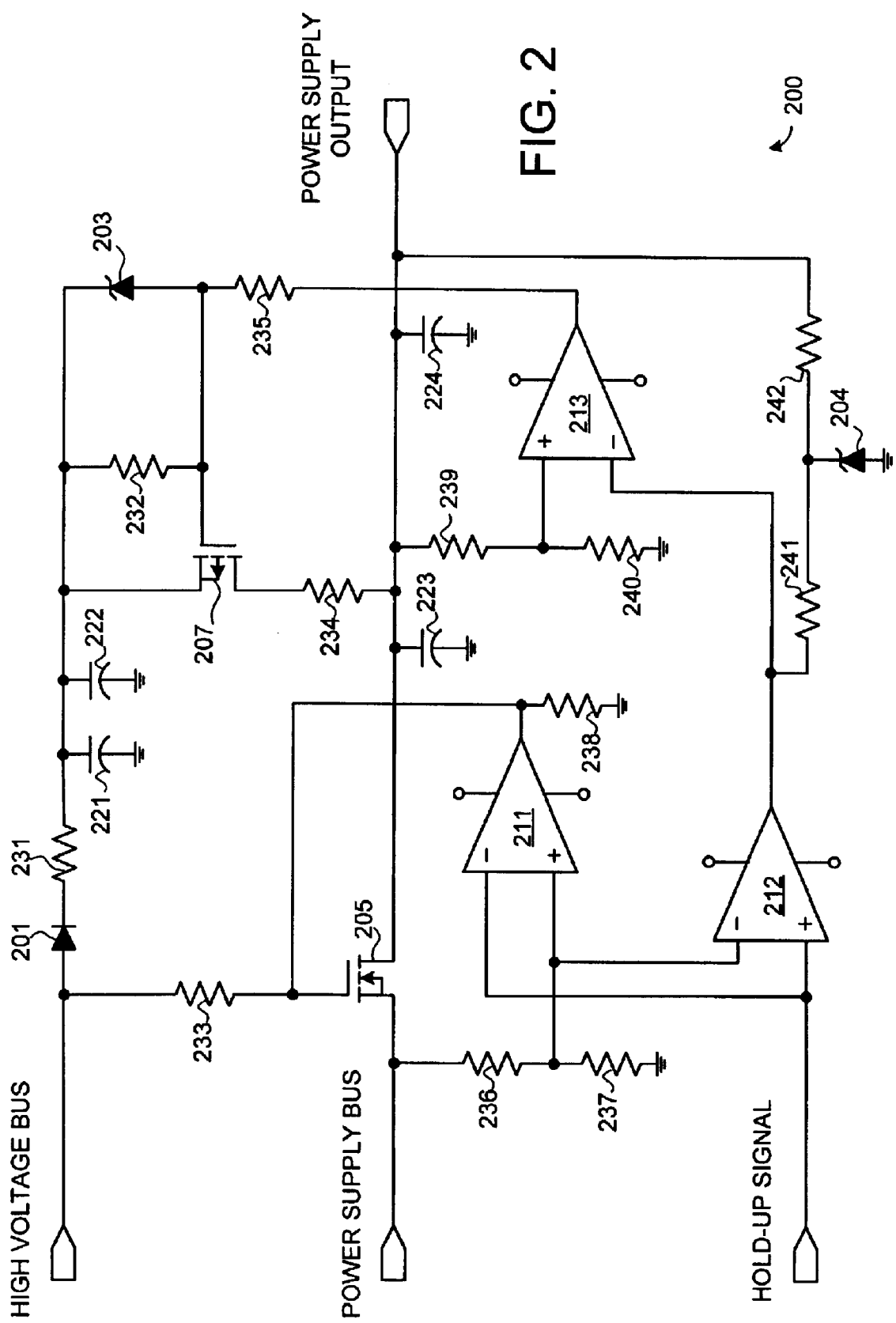
FIG. 2 is a schematic view of a preferred hold-up power supply system.

Turning now to FIG. 2, a detailed example of a hold-up power supply 200 is illustrated. The hold-up power supply 200 includes diode 201, zener diode 203, a precision zener diode 204, FETs 205 and 207, comparators 211, 212 and 213, capacitors 221, 222, 223 and 224, and resistors 231, 232, 233, 234, 235, 236, 237, 238, 239, 240, 241 and 242.

The hold-up power supply 200 receives power from a high voltage bus input and a power supply bus input, and provides power to flash memory through a power supply output. The hold-up power supply 200 receives a hold-up signal that is used to indicate when a power loss is about to occur.

FET 205 preferably comprises an n-channel FET while FET 207 preferably comprises a p-channel FET. These FET types are preferred for the polarity of the power supply bus and high voltage bus in this application, however, other applications may preferably use other FET types. In fact, other switch devices, such as bipolar transistors could be used in the place of the FETs shown in FIG. 2. Comparators 211, 212 and 213 preferably comprise open collector comparators such as LM139 comparators. Capacitors 221 and 222 store the energy needed to momentarily power the flash memory system. While hold-up power supply 200 uses two capacitors in parallel for this purpose, more or less capacitors could be used depending upon specific application requirements. Additionally, in some cases capacitance could be provided with the flash memory themselves. Capacitors 223 and 234 provide control over ripple voltage at the power supply output. As one specific example, capacitors 221 and 222 can comprise 47 microfarad capacitors, while capacitor 223 comprises 560 microfarads and capacitor 224 comprises 0.47 microfarads. Again, as one example resistor 231 comprises a 100 ohms resistor, resistor 232, 233, 236, 239, 240 and 241 comprise 10 k ohm resistors, resistor 237 comprises a 3.92 k ohm resistor, resistor 238 comprises a 39.2 k ohm resistor, resistors 242 and 235 comprise 1 k ohm resistors, and resistor 234 comprises a 1.21 ohm resistor. Also in this example, zener diode 204 is preferably 2.5 volts.

During normal operation, the hold-up signal is held low. The low hold-up signal is delivered to the negative input of comparator 211 and the positive input of comparator 212. The positive input of comparator 211 and the negative input of comparator 212 receive a voltage from the power supply bus as determined by the voltage divider comprising resistors 236 and 237. During normal operation, the voltage provided by the voltage divider is higher with respect to the low hold-up signal, and thus comparator 211 is in high impendence mode and its output floats. This allows the output of comparator 211 to be controlled by the voltage from the high voltage bus as determined by the voltage divider comprising resistors 233 and 238. This high voltage is applied to the gate of NFET 205 and turns it on. Thus, during normal operation, the power supply bus is connected to the power supply output, powering the flash memory system.

Conversely, with the low hold-up signal lower than the voltage from the voltage divider, the comparator 212 output is pulled toward ground in a low impedance state. The low output of comparator 212 is passed to the negative input of comparator 213, while the positive input of comparator 213 receives voltage from the power supply bus as determined by resistors 239 and 240. This causes the output of comparator 213 to be high impedance mode and its output floats. When 213 is in the open state, resistor 232 causes the gate to source voltage of PFET 207 to be near zero, turning PFET 207 off. Thus during normal operation the high voltage bus is disconnected from the power supply output.

When a power loss occurs, the hold-up signal goes high. The high hold-up signal at the negative input of comparator 211 causes the output of comparator 211 to be pulled low to ground. This low signal is passed to the gate of NFET 205 turning it off. This disconnects the power supply bus from the power supply output, and prevents power supplied by the hold-up power supply 200 from flowing back into the power supply bus.

The high hold-up signal at the positive input of the comparator 212 causes the output of comparator 212 to float. Thus, the voltage at the negative input of comparator 213 is determined by resistors 241, 242 and zener diode 204. The zener diode 204 supplies a reference voltage even when the power supply output has dropped below its normal level. For example, where the power supply output is a 5 volt output, the zener diode 204 and resistors 241 and 242 will provide 2.5 volts even when the power supply output has dropped below normal levels. This voltage is used in hold-up power supply 200 as a reference voltage to determine when comparator 213 is turned on. In this embodiment, the value of the zener diode 204 was chosen to be 2.5 volts to allow it be accurate even when the power supply output is much less than its nominal value of 5 volts. Resistor 242 supplies sufficient current to zener diode 204 to cause it to be 2.5 volts even when the power supply output has dropped to only 3.5 volts. The ratio of resistors 239 and 240, in conjunction with zener diode 204 thus provide a dependable reference voltage to comparator 213. This facilitates the comparator 213 properly determining the power supply output voltage during operation in the hold-up mode. It should be understood that the reference could be provided by elements other than the illustrated zener diode 204. For example, it can be provided with precision integrated circuit voltage reference such as a LT1009 voltage reference.

Due to component tolerances, when the power supply bus first fails, the voltage provided from the power supply bus through resistors 239 and 240 to the positive input of comparator 213 may be higher or lower than the reference voltage provided by device 204 through resistor 241 to the negative input of comparator 213. However, due to the flash memory system drawing power from the power supply output, the voltage on the power supply output will drop below the operational voltage. Thus, the voltage at the negative input of comparator 213 begins to exceed the voltage at the positive input of comparator 213. This causes comparator 213 to go to the low state. The voltage at the gate of PFET 207 is then determined by the voltage provided from the high voltage bus through resistor 232 and 235. This causes the PFET 207 to momentarily turn on, allowing current to flow from the capacitors 221 and 222 to the power supply output. Thus, the needed voltage to operate the flash memory is provided from capacitors 221 and 222.

As the voltage on the power supply output again rises to operational levels, the positive input of comparator 213 rises and the comparator output again goes open. This turns off PFET 207 until the voltage on the power supply output again drops below operational levels. Thus, when the hold-up signal is high, the reference voltage from device 204, comparator 213 and PFET 207 work together using feedback to controllably provide the appropriate voltage at the power supply output. Thus, the flash memory systems powered by the power supply output can continue to operate until the power from capacitors 221 and 222 is exhausted. This allows the flash memory to finish writes and erasures, allowing a graceful shutdown.

Again, it should be noted that many of the elements illustrated in hold-up power supply 200 are not necessary and could be replaced or supplemented with additional elements. For example, resistor 234 is used to insure that excessive current does not flow from capacitors 222 and 221 during hold up. This same result could be achieved using an inductor of appropriate size. This would have the advantage of preventing the current from changing immediately, and possibly allow the use of smaller storage capacitors.

In some cases the power supply output provided by the hold-up power supply 200 will not be at the correct voltage to operate the flash memory. In these cases, voltage regulators can be provided to convert the power supply output to the correct voltage. Turning now to FIG. 3, a voltage regulator 300 is illustrated that receives a power supply input and provides two regulated outputs. The voltage regulator 300 uses two three-terminal regulators to provide these regulated outputs. As an example, when supplied with a five volt power supply input, the voltage regulator 300 can be configured to output two regulated 3.3 volt outputs. This allows modern flash memory systems that use this voltage to be powered off the five volt power supply input. Of course, different applications may require different voltage outputs and receive different voltage inputs. Other applications may not require the use of a voltage regulator 300 at all.

In the illustrated embodiment, voltage regulator 300 comprises two three terminal regulators, capacitors 301, 302, 303, 304, 305 and 306, and resistors 311, 312, 313, and 314. As an example implementation, the capacitors 301 and 304 comprise 0.47 microfarads and the capacitors 302, 303, 305 and 306 comprise 47 microfarads. In this implementation, resistors 311 and 313 comprise 200 ohms, and resistors 312 and 314 comprise 121 ohms.

The present invention thus provides hold-up power supply for flash memory systems. The hold-up power supply provides the flash memory with the power needed to temporarily operate when a power loss exists. This allows the flash memory system to complete any erasures and writes, and thus allows it to shut down gracefully. The hold-up power supply detects when a power supply loss on a power supply bus is occurring and supplies the power needed for the flash memory system to temporally operate. The hold-up power supply stores power in at least one capacitor. During normal operation, power from a high voltage supply bus is used to charge the storage capacitors. When a power supply loss is detected, the power supply bus is disconnected from the flash memory system. A hold-up controller controls the power flow from the storage capacitors to the flash memory system. The hold-up controller uses feedback to assure that the proper voltage is provided from the storage capacitors to the flash memory system. This power supplied by the storage capacitors allows the flash memory system to complete any erasures and writes, and thus allows the flash memory system to shut down gracefully.

The embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed. Many modifications and variations are possible in light of the above teaching without departing from the spirit of the forthcoming claims.

What is claimed is:

1. A hold-up power supply for a flash memory system comprising:
   a) a power supply output coupled to the flash memory system, the power supply output providing a power supply voltage to the flash memory system;
   b) a high voltage bus coupled to the power supply output through a first switch;
   c) at least one capacitor coupled to store a high voltage charge from the high voltage bus, the high voltage charge having a higher voltage than the power supply voltage; and d) a hold-up controller, the hold-up controller including a comparator, the comparator comparing voltage from the power supply output to a reference voltage and selectively activating the first switch to selectively connect the at least one capacitor to the power supply output to provide a voltage that at least approximates the power supply voltage from the capacitor to temporarily power the flash memory system during a power loss.

2. The hold-up power supply of claim 1 wherein the first switch comprises a field effect transistor.

3. The hold-up power supply of claim 1 further comprising a power supply bus coupled to the power supply output through a second switch.

4. The hold-up power supply of claim 3 wherein the hold-up controller activates the second switch to disconnect the power supply bus from the power supply output during the power loss.

5. The hold-up power supply of claim 1 wherein the hold-up controller receives a hold-up signal indicating the power loss.

6. The hold-up power supply of claim 1 further comprising a fist diode to prevent power flow back into the high voltage bus during the power loss.

7. The hold-up power supply of claim 1 further a resistive element between the first switch and the power supply output to limit current flow to the power supply output.

8. The hold-up power supply of claim 1 further an inductive element between the first switch and the power supply output to limit current flow to the power supply output.

9. A hold-up power supply for a flash memory system comprising:
  a) a power supply output coupled to the flash memory system, the power supply output providing a power supply voltage to the flash memory system;
  b) a high voltage bus coupled to the power supply output through a first switch;
  c) at least one capacitor coupled to store a high voltage charge from the high voltage bus the high voltage charge having a higher voltage than the power supply voltage;
  d) a power supply bus coupled to the power supply output through a second switch; and
  e) a hold-up controller receiving a hold-up signal, the hold up controller including a first comparator and a second comparator, the second comparator comparing the hold-up signal to a signal from the power supply bus and activating the second switch to disconnect the power supply bus from the power supply output when the hold-up signal indicates a loss of power in the power supply bus, the first comparator comparing voltage from the power supply output to a reference voltage and selectively activating the first switch to connect the at least one capacitor to the power supply output to at least temporarily provide a desired voltage that at least approximates the power supply voltage to the power supply output.

10. The hold-up power supply of claim 9 wherein the reference voltage is provided by a zener diode coupled the power supply output.

11. The hold-up power supply of claim 9 further comprising a diode coupled to the high voltage bus to prevent power flow back into the high voltage bus during power loss.

12. The hold-up power supply of claim 9 wherein the first switch comprises a p-type field effect transistor and wherein the second switch comprises an n-type field effect transistor.

13. The hold-up power supply of claim 9 further a resistive element between the first switch and the power supply output to limit current flow to the power supply output.

14. A method for temporarily powering a flash memory system during a power loss in a power supply bus:
  a) storing high voltage power in at least on capacitor coupled to the flash memory system through a first switch and a power supply output, the high voltage power having a higher voltage than the power supply bus;
  b) disconnecting the power supply bus from the power supply output when the power loss is detected; and
  c) selectively providing power from the at least one capacitor through the first switch to the power supply output to temporarily power the flash memory system by comparing a voltage on the power supply output with a reference voltage and closing the first switch when the reference voltage exceeds the voltage on the power supply.

15. The method of claim 14 wherein the reference voltage is provided by a zener diode coupled to the power supply output.

16. The method of claim 14 wherein the step of disconnecting the power supply bus from the power supply output occurs in response to a hold-up signal.

* * * * *